United States Patent [19]

Marques et al.

[11] Patent Number: 5,339,066

[45] Date of Patent: Aug. 16, 1994

[54] ENERGY-MEASURING RESISTOR BANK

[75] Inventors: Anthony M. Marques, Lexington; Paul R. Kelley, Needham, both of Mass.; William K. Jones, Islamorada, Fla.; Masatoshi Fukuda, Tewksbury; Overton H. Manuel, Brockton, both of Mass.

[73] Assignee: The United States of America as represented by the Secretary of the Navy, Washington, D.C.

[21] Appl. No.: 45,340

[22] Filed: Mar. 30, 1993

[51] Int. Cl.$^5$ ............................................. H01C 1/012
[52] U.S. Cl. ................................... 338/306; 338/307; 338/308; 338/320; 29/610.1; 324/691
[58] Field of Search ............... 338/320, 195, 260, 306, 338/307, 308; 361/78, 93; 324/549, 691, 713, 126, 133; 29/610.1; 323/293

[56] References Cited

U.S. PATENT DOCUMENTS 4,703,389 10/1987 Scott ...................................... 361/93

Primary Examiner—Marvin M. Lateef
Attorney, Agent, or Firm—Wayne O. Hadland

[57] ABSTRACT

A resistor bank consisting of a group of resistors formed on the surface of a die, all electrically connected together in parallel. All of the resistors have identical individual resistances, but each has a unique energy dissipating capacity. When an event subjects the resistor bank to a surge of current, some of the resistors blow out, thereby changing the resistance of the bank. By measuring the resistance of the bank before and after an event the energy of the surge can be determined.

3 Claims, 1 Drawing Sheet

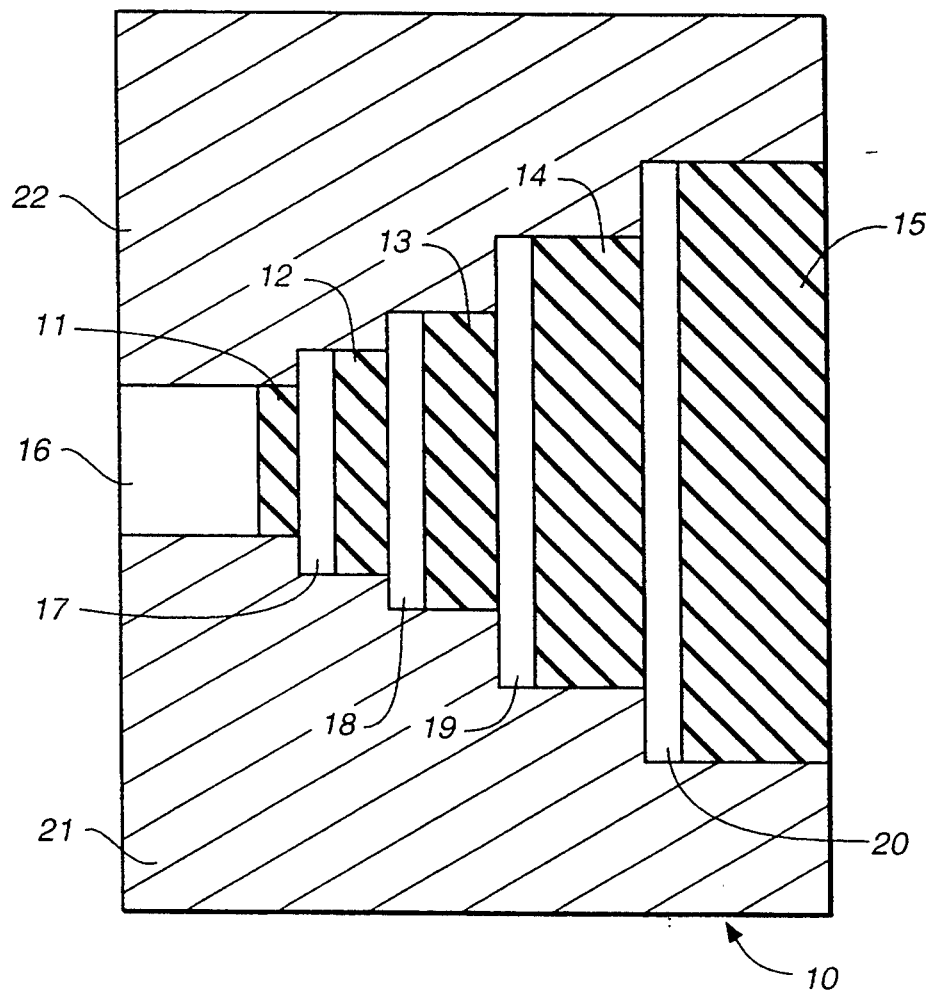
FIG._1

ENERGY-MEASURING RESISTOR BANK

FIELD OF THE INVENTION

The present invention relates to passive devices for measuring electrical energy, and more particularly to passive devices for measuring the energy of a surge of current induced into a microelectronic circuit by an environmental event, such as by a pulse of intense radiation.

BACKGROUND OF THE INVENTION

When microelectronic circuits are exposed to a pulse of intense radiation, such as a pulse of X-ray radiation from a nuclear explosion, charge displacements caused by photoemission of electrons can create a surge of current in a circuit that carries enough energy to damage sensitive microelectronic components.

Prior-art methods of measuring the energy of such currents included using active recording instrumentation to measure the time history of voltage across (or current through) a known resistance. When test conditions require that measurements be taken simultaneously at many points, the instrumentation requirements often fall between burdensome and overwhelming.

Hence there is a need for a small passive energy-measuring device that can be readily incorporated into the design of prototype circuits that are intended to be subjected to radiation testing.

OBJECTS, FEATURES, AND ADVANTAGES

It is an object of the instant invention to provide a passive device for measuring the energy contained in a surge of electrical current.

It is a feature of the instant invention that all of the resistors in the bank have identical individual resistances.

It is a feature of the instant invention that each individual resistor in the bank has a unique energy dissipating capacity.

It is a feature of the instant invention that it can be packaged in the same manner as an integrated circuit.

It is an advantage of the instant invention that it can be mounted adjacent to (or even integrated into) an integrated circuit that is to be measured.

It is an advantage of the instant invention that it requires no additional wiring or instrumentation to be present at the time of the event being investigated.

SUMMARY OF THE INVENTION

The energy-measuring resistor bank of the present invention consists of a group of resistors connected together in parallel, all contained on the surface of a die. When the bank is subjected to a surge of electrical current, some of the resistors in the bank blow out (in the manner of a fuse), thereby changing the resistance of the bank. By measuring the resistance of the bank before and after a connected circuit is exposed to a pulse of radiation, the number of resistors blown can be ascertained, and hence the energy of the surge that was induced in the circuit determined. Hence the resistor bank functions as a two-port passive energy measuring device that does not require additional wiring or instrumentation to be present at the time of the event being investigated.

BRIEF DESCRIPTION OF THE DRAWING

FIG. 1 is a view of an energy-measuring resistor bank die, showing five cross-hatched resistor zones, five clear regions, and two conductively-coated areas.

DRAWING REFERENCE NUMERALS

10: energy-measuring resistor bank
11: R1, first resistor
12: R2, second resistor
13: R3, third resistor
14: R4, fourth resistor
15: R5, fifth resistor
16: first clear region
17: second clear region
18: third clear region
19: fourth clear region
20: fifth clear region
21: first conductively-coated area
22: second conductively-coated area

DESCRIPTION OF THE PREFERRED EMBODIMENT

FIG. 1 is a view of a completed die, representing a preferred embodiment of the energy-measuring resistor bank 10 of the instant invention. Shown are five rectangular clear regions 16, 17, 18, 19, and 20 (clear regions being regions that are not coated by either conductive material nor resistive material). Also shown are five cross-hatched resistor zones 11, 12, 13, 14, and 15 (zones coated by resistive material but not by conductive material) forming corresponding resistors R1, R2, R3, R4, and R5. First and second conductively-coated areas, 21 and 22 respectively, are coated with an electrically conductive material (which optionally can be applied on top of the underlying resistive material); they serve to electrically connect the five resistors 11 through 15 in parallel between a first external electrical wire connector bonded to the first area 21 and a second external electrical wire connector bonded to the second area 22.

This preferred embodiment of the energy-measuring resistor bank can be fabricated by thin-film processing techniques (for producing multiple rectangular dies) that are well known in the semiconductor microelectronics industry. A flat ceramic or glass substrate (commonly of about one-half millimeter in thickness) is mounted in a processing chamber. A thin uniform layer of resistive material (e.g., about 200 Angstroms thickness of 50% Ni, 50% Cr) is deposited on a surface of the substrate, followed by a deposition of a thicker uniform layer of conductive material (e.g., about 1 micron thickness of aluminum, or other conductive material that is compatible with the resistive material). Next, a pattern for the parallel resistors 11, 12, 13, 14, and 15 is constructed (on each die) by removing both resistive and conductive material from rectangular regions 16, 17, 18, 19, and 20 on the substrate surface. Finally, the top conductive coating is removed from the cross-hatched resistor regions, leaving only parallel strips of resistive material to bridge between two conductively-coated areas 21 and 22; thereby forming (on each die) a bank of five spatially-parallel resistors 11, 12, 13, 14, and 15, electrically connected together in parallel. Each completed die can be mounted in a package by well-known die attach techniques, with wire connectors bonded to each end of the resistor bank (i.e., to the conductively-coated areas 21 and 22), and the package sealed.

For a prototype apparatus, the substrate material used was a complex soda-lime glass (Corning brand cover glass #2) which contains a number of mobile species; more specifically a high borosilicate with the following additions: $(SiO_2*B_2O_3)*(K_2O, Na_2O, ZnO, TiO)$. The resistive material was an electron-beam-deposited layer of nickel and chromium about 200 Angstroms thick, from a high purity source having an initial composition of 80% Ni, 20% Cr (Nichrome V) yielding a film of 50% Ni, 50% Cr composition (due to the differences in the vapor pressures of the two elements). The conductor material was high purity (99.999 percent) electron-beam-deposited aluminum 1.3 microns thick. A 0.35 micron thick passivation top layer of glass was deposited from a quartz single-crystal rod to provide mechanical protection.

In operation the resistor bank is placed in series in a circuit in which a surge is expected to occur. The energy being measured is converted to heat within each resistor under adiabatic or nearly adiabatic conditions, and melts open some of the individual resistors (the use of the term "adiabatic" herein means that it is assumed that all the heat which is generated in a resistor remains in that resistor and does no heating of the underlying substrate material). The resistor bank is calibrated such that the change in resistance from before to after a surge may be used to determine the energy to which it was subjected.

Referring to FIG. 1, resistors $R_1$, $R_2$, $R_3$, $R_4$ and $R_5$ (i.e., resistors 11, 12, 13, 14, and 15) each have the same individual resistance value, but each has a different cross-sectional area. The cross-sectional area increases from the smallest $R_1$ to the largest $R_5$. The resistive material thickness is the same for all of the resistors. Therefore (for resistors of rectangular form and identical individual resistance) the energy required to blow (i.e., melt open) a resistor is proportional to the square of the width of the resistor. The width of the resistors can be arbitrarily selected to give a larger or smaller range, as desired. The smallest resistor value can also be selected so as to be as sensitive as desired, limited only by the constraints of the fabrication process. The resistor pattern shown in FIG. 1, for example, shows the width (and hence also the length) of each successively larger resistor as being 1.414 times the corresponding dimension of the preceding resistor (resulting in a doubling of energy capacity for each successive resistor). Following is a definition of symbols used herein:

N = the total number of resistors in a bank of resistors
n = the number of a particular resistor
p = the largest (in cross-sectional area) blown resistor
$X_n$ = the individual amount of energy required to blow (i.e., melt open) the individual resistor number "n"; i.e., the energy capacity of resistor "n"
$E_p$ = the total amount of energy required to blow (i.e., melt open) all the resistors 1 through p in a resistor bank.

When total energy $E_1$ is applied to the resistor bank, energy $X_1$ blows resistor $R_1$, and the same amount of energy $X_1$ is dumped into each of the four remaining resistors ($R_2$, $R_3$, $R_4$ and $R_5$) which do not blow because they have larger cross-sectional areas than $R_1$ and thus have a larger capacity for dissipating energy.

$$E_1 = 5(X_1)$$

When energy $E_2$ is applied to the resistor bank, resistor $R_1$ blows with energy $X_1$, resistor $R_2$ blows with energy $X_2$, and the same amount of energy $X_2$ is dumped into each of the three remaining resistors ($R_3$, $R_4$ and $R_5$) which do not blow because they are larger in cross-sectional area than $R_2$.

$$E_2 = X_1 + 4(X_2) = E_1 + 4(X_2 - X_1)$$

$$E_3 = X_1 + X_2 + 3(X_3) = E_2 + 3(X_3 - X_2)$$

$$E_4 = X_1 + X_2 + X_3 2(X_4) = E_3 + 2(X_4 - X_3)$$

$$E_5 = X_1 + X_2 + X_3 + X_4 + X_5 = E_4 + 1(X_5 - X_4)$$

Similarly, $E_p$ blows all resistors from n=1 through n=p−1 with energy equal to the sum of the individual energies from $X_1$ through $X_{p-1}$, blows resistor $R_p$ with energy $X_p$, and dumps the same amount of energy $X_p$ into the remaining resistors from n=p+1 through n=N.

$$E_p = \sum_{n=1}^{n=p-1} (X_n) + (N + 1 - p)X_p =$$

$$E_{p-1} + (N + 1 - p)(X_p - X_{p-1})$$

If the first resistor as shown in FIG. 1 has, for example, an energy capacity of 1 micro-joule, the energy capacities of the remaining four resistors will be:
$X_1$ = 1 micro-joule
$X_2$ = 2 micro-joules
$X_3$ = 4 micro-joules
$X_4$ = 8 micro-joules
$X_5$ = 16 micro-joules Resulting in the following values for E1 through E5:
$E_1$ = 0.0+5(1) = 5.0 micro-joules
$E_2$ = 5.0+4(2−1) = 9.0 micro-joules
$E_3$ = 9.0+3(4−2) = 15.0 micro-joules
$E_4$ = 15.0+2(8−4) = 23.0 micro-joules
$E_5$ = 23.0+1(16−8) = 31.0 micro-joules While this invention has been described in conjunction with a preferred embodiment thereof it is obvious that modifications and changes therein may be made by those skilled in the art without departing from the scope of this invention as defined by the claims appended hereto.

That which is claimed is:

1. An energy-measuring resistor bank, comprising:
   a substrate having a flat surface;
   at least two resistors, each of said resistors being of identical individual resistance value and each of said resistors having a unique energy dissipating capacity, each resistor having a first end and a second end, each resistor being formed of a corresponding strip of resistive material deposited on the flat surface of said substrate;
   a first connecting means for electrically connecting together the first ends of all said resistors; and
   a second connecting means for electrically connecting together the second ends of all said resistors.

2. An energy-measuring resistor bank as recited in claim 1, wherein said first and second connecting means are formed by a process comprising the steps of:
   depositing a layer of resistive material onto said substrate flat surface; and
   depositing a layer of conductive material on top of the layer of resistive material.

3. A method for measuring the energy contained in a surge of current that has been induced into a circuit, comprising the steps of:

forming a resistor bank by connecting together in parallel a group of at least two resistors, all of said resistors being of identical individual resistance value and each of said resistors having a known unique energy dissipating capacity;

measuring the resistance of said resistor bank;

placing said resistor bank in series in the circuit in which the surge is expected to occur;

measuring the resistance of said resistor bank after the surge has occurred;

ascertaining the number of resistors that were blown out by the surge; and calculating the energy that was required to blow out the number of blown out resistors.

* * * * *